(12) United States Patent
Lo

(10) Patent No.: US 6,480,384 B2
(45) Date of Patent: Nov. 12, 2002

(54) CLIP FOR HEAT SINK

(75) Inventor: Wei-Ta Lo, Miou-Li (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/730,036

(22) Filed: Dec. 4, 2000

(65) Prior Publication Data

US 2002/0036891 A1 Mar. 28, 2002

(30) Foreign Application Priority Data

Sep. 26, 2000 (TW) .................................. 89216654 U

(51) Int. Cl.⁷ ................................................. H05K 7/20
(52) U.S. Cl. ....................... 361/704; 361/707; 361/702; 257/712; 165/80.3
(58) Field of Search .................... 361/690, 694–697, 361/703, 704, 707, 710, 711, 715, 717–719; 257/706–727; 24/464, 466, 473, 625; 165/80.2, 80.3, 80.4, 121, 122, 185; 174/16.3; 411/352, 900, 516, 522; 248/316.7, 505, 510

(56) References Cited

U.S. PATENT DOCUMENTS

| | | | | |
|---|---|---|---|---|
| 5,638,258 A | * | 6/1997 | Lin | 361/704 |
| 5,828,553 A | * | 10/1998 | Chiou | 361/704 |
| 5,870,288 A | * | 2/1999 | Chen | 361/704 |
| 5,979,025 A | * | 11/1999 | Horng | 24/459 |
| 6,023,827 A | * | 2/2000 | Boe | 29/443.56 |
| 6,023,832 A | * | 2/2000 | Boe | 29/426.6 |
| 6,061,239 A | * | 5/2000 | Blomquist | 361/704 |
| 6,082,440 A | * | 7/2000 | Clemens et al. | 165/80.3 |
| 6,181,559 B1 | * | 1/2001 | Seo | 361/704 |
| 6,201,697 B1 | * | 3/2001 | McCullough | 361/704 |
| 6,318,452 B1 | * | 11/2001 | Lee | 165/80.3 |

* cited by examiner

Primary Examiner—Darren Schuberg
Assistant Examiner—Michael Datskovsky
(74) Attorney, Agent, or Firm—Wei Te Chung

(57) ABSTRACT

A clip (40) adapted to attach a heat sink (30) to an electronic device (20) includes a body (50) and a lever (70). The lever is fastened to the body with a pivot (96). The lever includes a pressing portion (74) and a bore (80). First and second contact points (76, 78) are defined at a lower edge of the pressing portion at different distances from the bore. The clip is initially placed in a groove (36) of the heat sink, whereupon the first contact point abuts a top surface of the groove. When the lever is fully depressed, the second contact point firmly abuts the top surface of the groove. Thus the clip securely attaches the heat sink to the electronic device.

20 Claims, 6 Drawing Sheets

CLIP FOR HEAT SINK

BACKGROUND OF THE INVENTION

1. Field of the Invention

The present invention relates to a clip, and particularly to a clip for readily securing a heat sink to a heat-generating electronic device.

2. Related Art

A heat sink is usually placed in contact with a heat-generating electronic device, such as a Central Processing Unit (CPU), for removing heat there-from. A clip is usually used to secure the heat sink to the electronic device.

A conventional clip is disclosed in Taiwan Patent Application No. 83217100A01. The clip includes a pressing portion located in a slot defined between heat sink fins, for pressing the heat sink on the electronic device. A pair of arms, each with an aperture therein, depends from respective opposite ends of the pressing portion. The apertures engage with corresponding catches of a retention module. The heat sink is thereby secured to the electronic device.

However, due to inherent hardness of the clip, it is laborious to secure the clip to the retention module just by hand. Thus, another kind of conventional clip has an opening defined in each arm above the aperture. A tool is inserted into one of the openings to effect assembly or disassembly. Unfortunately, this makes assembly and disassembly procedures complicated and inconvenient.

Still another conventional clip is found in Taiwan Patent Application No. 86202080. A sunken central pressing portion is formed between a pair of slanted resilient portions. A leg depends from one resilient portion, with its free end bent outwardly to form a hook. A horizontal connecting portion with a through hole extends from the other resilient portion. Another leg with a handle portion is detachably engaged with the connecting portion by means of a screw and a nut. Thus the assembly procedure is easier than that of prior art. Nevertheless, the assembly procedure is still unduly cumbersome and complicated for users.

SUMMARY OF THE INVENTION

Accordingly, an object of the present invention is to provide a clip which can readily secure a heat sink to an electronic device.

To achieve the above object, a clip in accordance with the present invention includes a body and a lever. The lever is fastened to the body with a pivot. The lever includes a pressing portion and a bore. First and second contact points are defined at a lower edge of the pressing portion at different distances from the bore. The clip is initially placed in a groove of the heat sink, whereupon the first contact point abuts a top surface of the groove. When the lever is fully depressed, the second contact point firmly abuts the top surface of the groove. Thus the clip securely attaches the heat sink to the electronic device.

Other objects, advantages and novel features of the present invention will be drawn from the following detailed embodiments of the present invention with attached drawings, in which:

DETAILED DESCRIPTION OF THE PREFERRED EMBODIMENTS

Figure 1:
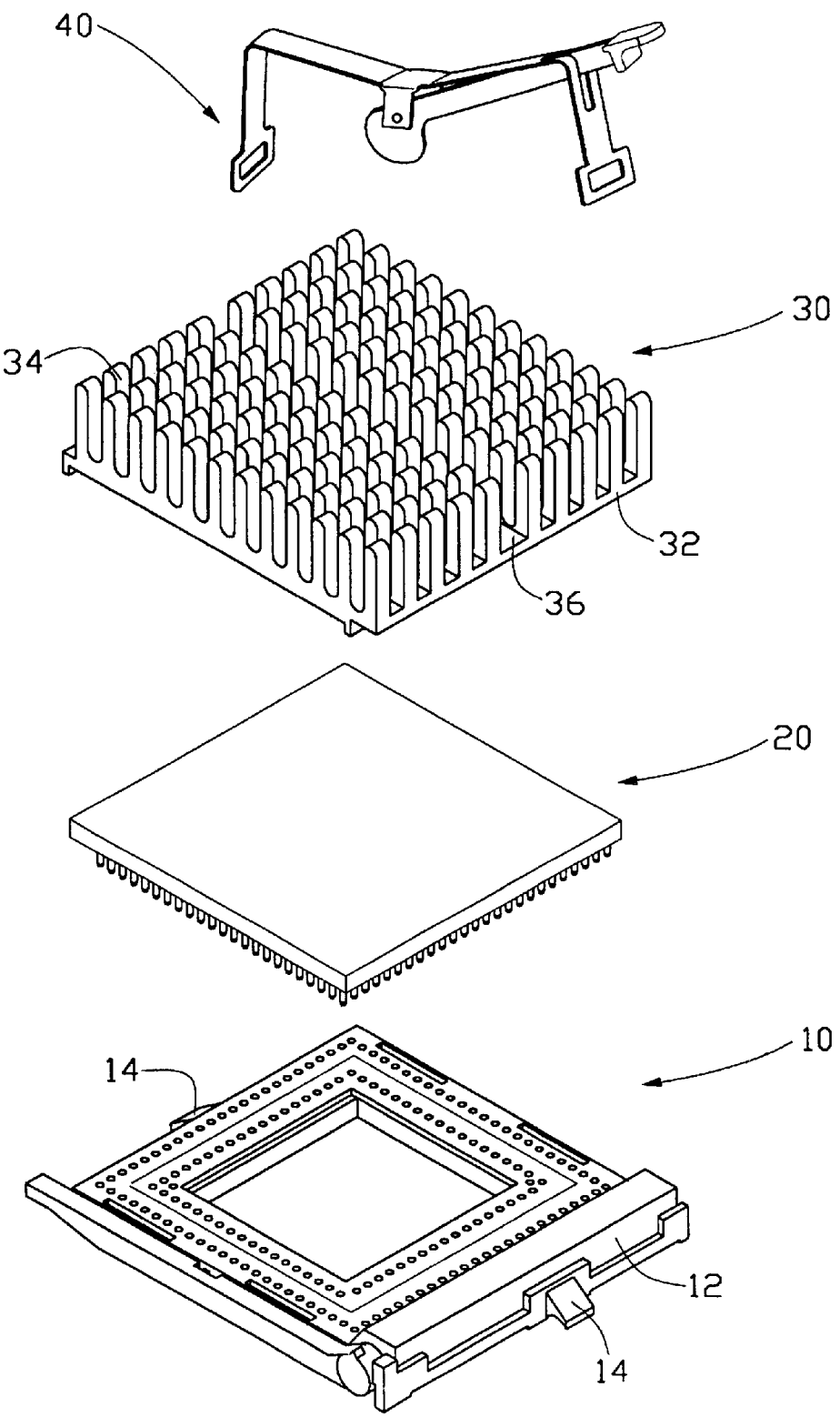
FIG. 1 is an exploded view of a clip in accordance with a preferred embodiment of the present invention, for securing a heat sink to an electronic device retained on a socket.

FIG. 1 shows a clip 40 in accordance with a preferred embodiment of the present invention, for securing a heat sink 30 to an electronic device 20 retained on a socket 10. The socket 10 is generally rectangular and has two opposite sidewalls 12. A pair of external catches 14 is respectively formed on the sidewalls 12 of the socket 10.

The heat sink 30 includes a chassis 32 and a plurality of fins 34 extending upwardly from an upper surface of the chassis 32. A groove 36 is defined through fins 34 at a center portion of the heat sink 30.

Figure 2:
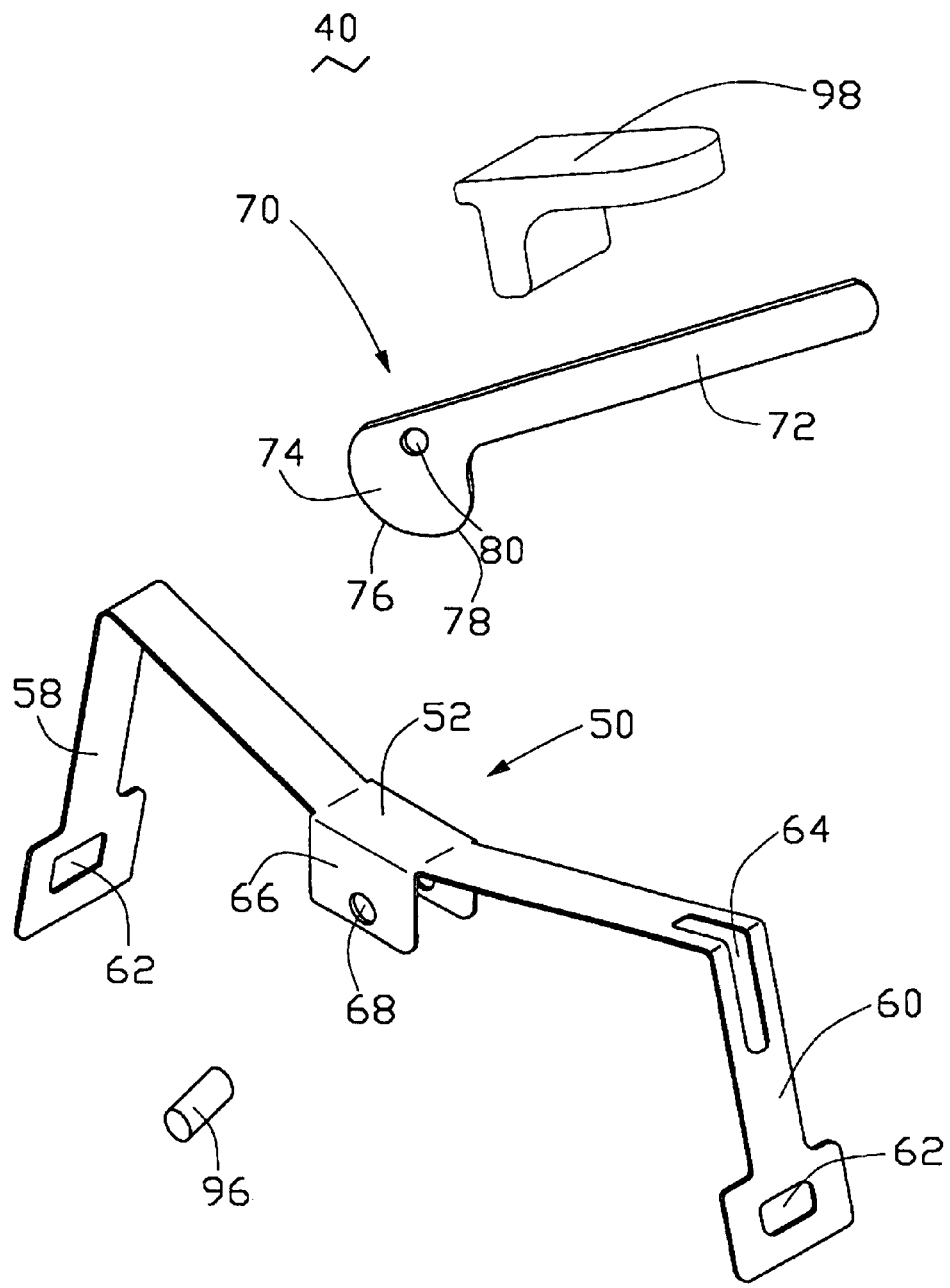
FIG. 2 is an exploded view of the clip of FIG. 1.

Referring also to FIG. 2, the clip 40 comprises an elongated body 50, a lever 70, a pivot 96 and a handle 98. The body 50 and the lever 70 are pivotally connected using the pivot 96. The handle 98 facilitates movement of the lever 70.

The body 50 of the clip 40 is stamped from a single plate, and includes a resilient portion 52, first and second legs 58, 60. A pair of tabs 66 depends from respective opposite longitudinal edges of the resilient portion 52. Each tab 66 defines a hole 68 therein. The first and second legs 58, 60 depend from respective opposite distal ends of the resilient portion 52. Each leg defines an opening 62 therein. A longitudinal slot 64 is defined to pass through both the resilient portion 52 and the second leg 60.

The lever 70 is also stamped from a single plate. The lever 70 includes a shaft 72 and a cam-shaped pressing portion 74. The pressing portion 74 defines a bore 80 therethrough, corresponding to the holes 68 of the body 50. The pressing portion 74 defines first and second contact points 76, 78 at a lower edge (not labeled) thereof. The first contact point 76 is closer to the bore 80 than is the second contact point 78.

Figure 3:
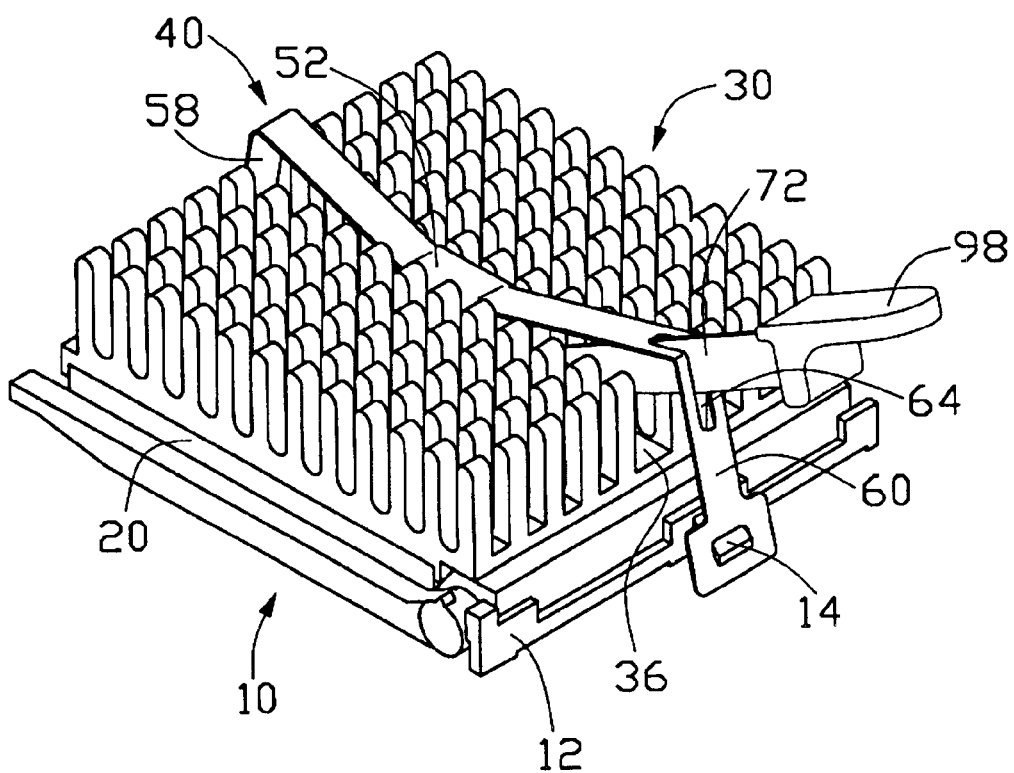
FIG. 3 is an assembled view of FIG. 1.
Figure 4:
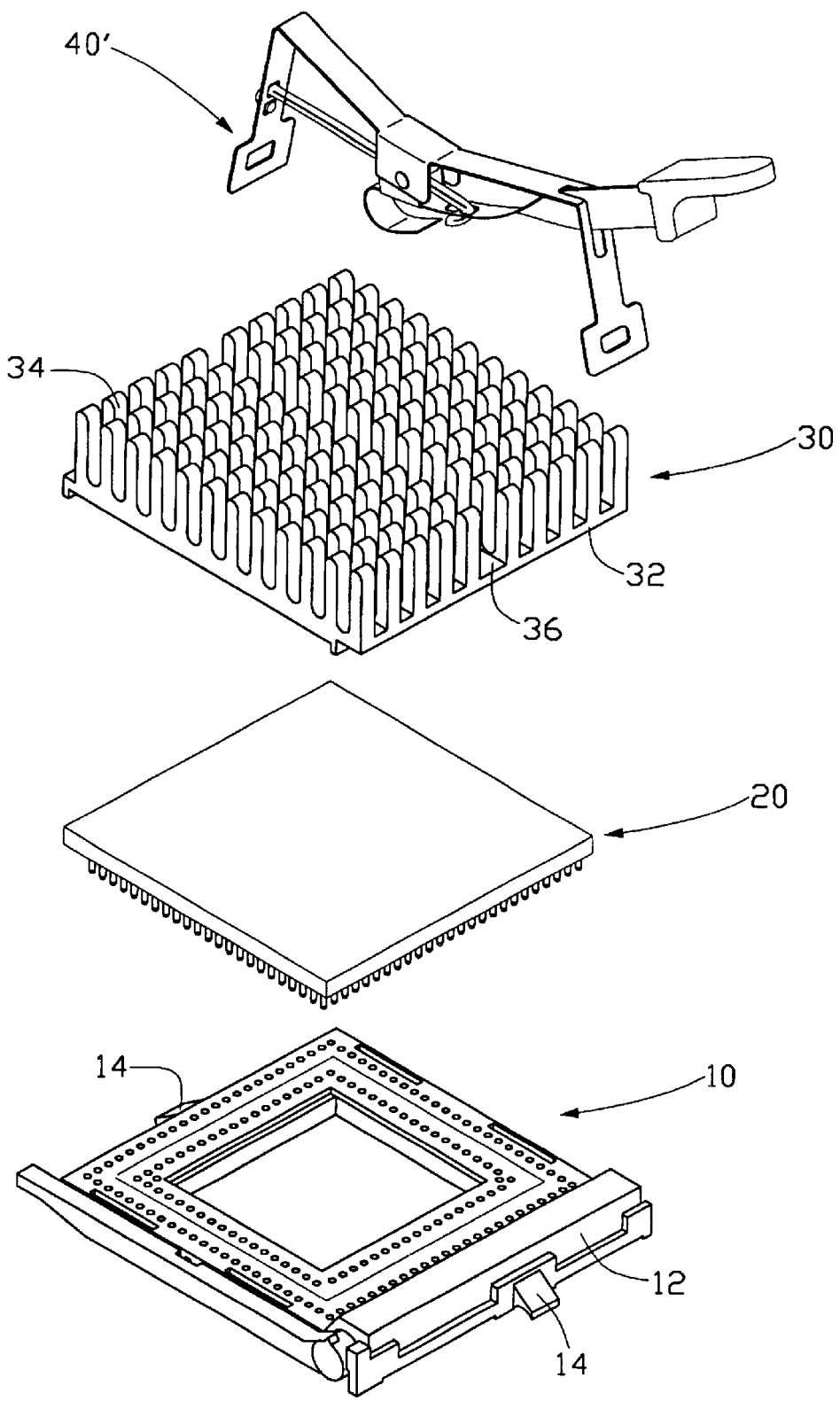
FIG. 4 is an exploded view of a clip in accordance with an alternative embodiment of the present invention, for securing a heat sink to an electronic device retained on a socket.

Referring also to FIG. 3, in pre-assembly, the electronic device 20 is mounted on the socket 10. The heat sink 30 is placed on a top surface of the electronic device 20. The shaft 72 of the lever 70 is inserted into the slot 64 of the body 50. The shaft 72 is inserted until the bore 80 of the lever 70 aligns between the holes 68 of the body 50. The pressing portion 74 of the lever 70 is now located between the tabs 66 of the body 50. The pivot 96 is inserted through the holes 68 and the bore 80, for providing movable engagement of the lever 70 with the body 50. The handle 98 is attached to a free end of the shaft 72 by conventional means.

In assembly, the clip 40 is placed in the groove 36 of the heat sink 30. The openings 62 of the first and second legs 58, 60 receive the corresponding catches 14 of the socket 10. The first contact point 76 of the lever 70 abuts a touching point (not visible) of a top surface of the groove 36 of the heat sink 30. The handle 98 is then depressed. The lower edge (not labeled) of the pressing portion 74 rotates at the touching point (not visible) until the second contact point 78 of the pressing portion 74 abuts the touching point (not visible). As a result, the resilient portion 52 of the body 50 is forced upward. The first and second legs 58, 60 are forced inward, thereby causing the openings 62 of the first and second legs 58, 60, to firmly engage the catches 14 of the socket 10. Thus the heat sink 30 is securely attached to the electronic device 20.

Figure 5:
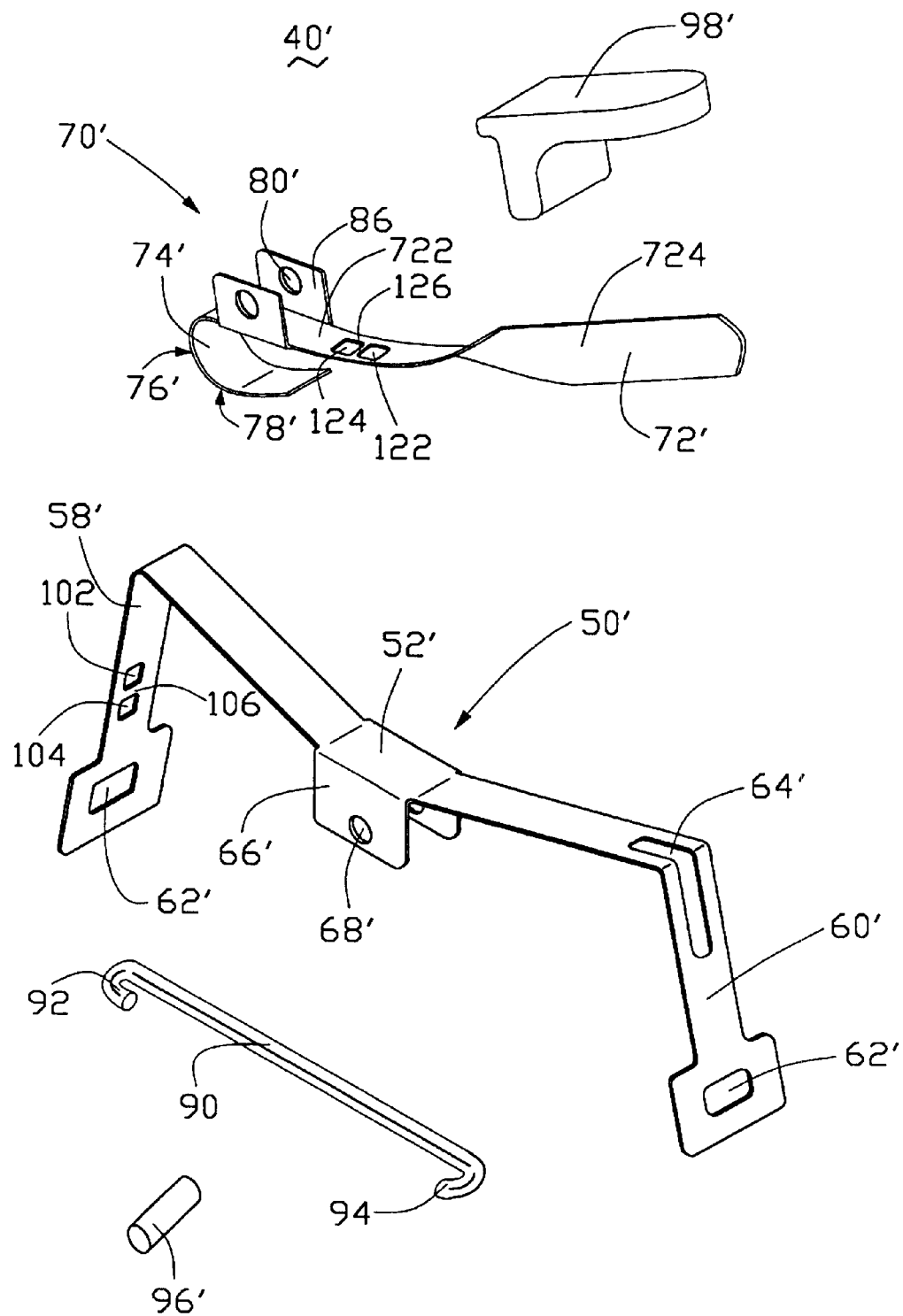
FIG. 5 is a exploded view of the clip of FIG. 4.

FIG. 5 shows a clip 40' in accordance with an alternative embodiment of the present invention. The clip 40' has a rod 90 for enhancing the fixing function of the clip 40'. The rod 90 is elongated, and ends thereof are bent toward each other to form first and second hooks 92, 94.

The body 50' is similar to the body 50 of the clip 40. However, a pair of vertically aligned first and second apertures 102, 104 is defined in the first leg 58' above the opening 62'. A rib 106 is thus formed in the first leg 58', separating the first and second apertures 102, 104.

The lever 70' includes a shaft 72', a pair of parallel flanges 86, and a pressing portion 74'. The shaft 72' comprises a horizontal first section 722 and a vertical second section 724. At an inner portion of the horizontal first section 722, the horizontal first section 722 progressively rotates along a longitudinal axis thereof until it has formed the vertical second section 724. The first section 722 defines a pair of longitudinally aligned first and second orifices 122, 124 therethrough. A partition 126 is thus formed in the first section 722, separating the first and second orifices 122, 124. The flanges 86 extend upwardly from respective opposite longitudinal edges of the first section 722, near an outer end of the first section 722. Each flange 86 defines a bore 80' therein, corresponding to the holes 68' of the body 50'. The pressing portion 74' extends arcuately and downwardly from the outer end of the first section 722, and defines first and second contact lines 76', 78' on an outer surface thereof. The first and second contact lines 76', 78' of the lever 70' have substantially the same functions as the first and second contact points 76, 78 of the lever 70 respectively.

Figure 6:
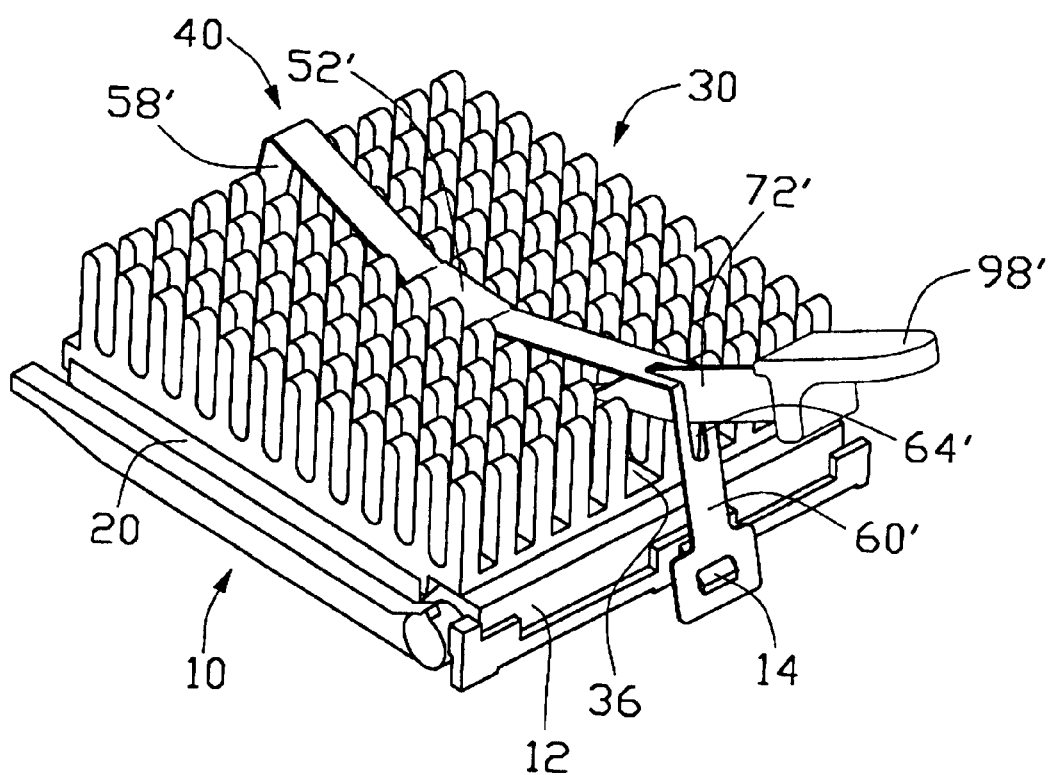
FIG. 6 is an assembled view of FIG. 4.

Referring alto FIG. 6, in pre-assembly, the second section 724 of the shaft 72' is inserted into the slot 64' of the body 50' until the bores 80' of the lever 70' align between the holes 68' of the body 50'. The flanges 86 of the lever 70' are now located between the tabs 66' of the body 50'. The first hook 92 of the rod 90 is passed under the body 50' and through the first aperture 102 of the first leg 58', and then pulled back to pass through the second aperture 104 of the first leg 58' in an opposite direction. Thus the first hook 92 is engaged with the rib 106 of the first leg 58'. The second hook 94 is engaged with the partition 126 of the shaft 72' in similar fashion. Then the pivot 96' is inserted through the holes 68' of the body 50' and the bores 80' of the lever 70', for providing movable engagement of the lever 70' with the body 50'. The rod 90 is now located below the pivot 96'. The handle 98' is attached to a free end of the shaft 72' by conventional means.

In assembly, the clip 40' is placed in the groove 36 of the heat sink 30. The openings 62' of the first and second legs 58', 60' receive the corresponding catches 14 of the socket 10. The first contact line 76' near the bores 80' abuts a touching line (not visible) of the top surface of the groove 36 of the heat sink 30. The handle 98' is then depressed until the second contact line 78' of the pressing portion 74' abuts the touching line (not visible). As a result, the resilient portion 52' of the body 50' is forced upward. The first and second legs 58', 60' of the body 50' are forced inward, thereby causing the openings 62' of the first and second legs 58', 60' to firmly engage the catches 14 of the socket 10. Simultaneously, the hook 94 of the rod 90 is forced downwardly, thereby causing the hook 92 of the rod 90 to rotatablely move upwardly. Thus the rod 90 enhances the fixing function of the clip 40'. The clip 40' prevents the heat sink 30 from moving relative to the electronic device 20 when the assembly is subjected to vibration or shock during normal operation. The heat sink 30 can continue to efficiently remove heat from the electronic device 20.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip adapted to secure a heat sink to an electronic device retained on a socket, comprising:

a body including a resilient portion, first and second legs depending from the resilient portion;

a lever pivotally connected to the resilient portion of the body thereby forming a pivot point, the lever comprising a pressing portion adapted to press the heat sink to the electronic device, the pressing portion defining a first contact point and a second contact point, the distance between the first contact point and the pivot point being shorter than that between the second contact point and the pivot point; and wherein when the clip is initially placed on the heat sink, the first contact point abuts a top surface of the heat sink, and when the clip is secured to the heat sink and the socket, the second contact point firmly abuts the top surface of the heat sink; and wherein a slot is defined to pass through both the resilient portion and the second leg, for insertion of the lever therethrough.

2. The clip as recited in claim 1, wherein the pivot point is a bore defined in the pressing portion of the lever.

3. The clip as recited in claim 1, wherein at least one tab depends from the resilient portion of the body, each tab defining a hole therein, and wherein the clip further comprises a pivot engaging with the bore and the holes for pivotally connecting the lever to the body.

4. The clip as recited in claim 1, wherein the pressing portion is substantially cam-shaped, and wherein the defined first and second contact points are points.

5. The clip as recited in claim 1, wherein a handle is attached to the lever, for facilitating attachment of the clip to the socket.

6. The clip as recited in claim 1, wherein the pressing portion extends arcuately and downwardly from an end of the lever, and wherein the defined first and second contact points are lines.

7. The clip as recited in claims 1, wherein the lever further comprises at least one flange extending upwardly from the lever, each flange having one bore defined therein, and wherein the resilient portion comprises at least one tab depending therefrom, each tab defining a hole therein, and wherein the clip comprises a pivot corresponding to the bores and the holes.

8. The clip as recited in claim 7, wherein the pivot point is the axial line of the bores.

9. The clip as recited in claim 1, wherein the clip further comprises a rod for enhancing the fixing function of the clip.

10. The clip as recited in claim 9, wherein a pair of first and second hooks is formed at respective opposite ends of the rod, two apertures are defined in the body thereby forming a rib for engaging with the first hook of the rod, and two orifices are defined in the lever thereby forming a partition for engaging with the second hook of the rod.

11. A clip adapted to secure a heat sink to an electronic device, comprising:

a body including a resilient portion, first and second legs depending from the resilient portion, and;

a lever pivotally connected to the resilient portion of the body thereby forming a pivot point, the lever comprising a pressing portion adapted to press the heat sink to the electronic device, the pressing portion defining a first contact point and a second contact point, the first and second contact points being at different distances from the pivot point; wherein the pressing portion extends arcuately and downwardly from an end of the lever, and wherein the defined first and second contact points are lines.

12. The clip as recited in claim 11, wherein the first contact point of the lever is closer to the pivot point than is the second contact point of the lever.

13. The clip as recited in claim 11, wherein the pivot point is a point or a line.

14. The clip as recited in claim 11, wherein the pressing portion is substantially cam-shaped, and wherein the defined first and second contact points are points.

15. An heat sink assembly comprising:

a socket;

an electronic device positioned on the socket;

a heat sink positioned on the electronic device and defining a groove therein;

a clip for attaching the heat sink to the socket, said clip including:

a body defining a resilient portion, first and second legs extending downwardly from two opposite ends of said resilient portion and latchably engaged with two sides of the socket; and a moveable piece including a pressing portion positioned between the resilient portion and a top surface of the heat sink; wherein said pressing portion is actuated to be in a first position where the resilient portion is closer to the top surface of the heat sink for loosely holding the heat sink on the socket while to be in a second position where the resilient portion is farther away from the top surface of the heat sink for firmly grasping the socket by means of the legs; wherein a rod is connected between the moveable piece and one of said first and second legs to actuate said one of the first and second legs to move inwardly when said the pressing portion is in the second position.

16. The assembly as recited in claim 15, wherein said moveable piece is a lever.

17. The assembly as recited in claim 16, wherein said lever extends along a longitudinal direction of said resilient portion.

18. The assembly as recited in claim 15, wherein said pressing portion abuts against the top surface of the heat sink.

19. A clip adapted to secure a heat sink to an electronic device retained on a socket, comprising:

a body including a resilient portion, first and second legs depending from the resilient portion;

a lever pivotally connected to the resilient portion of the body thereby forming a pivot point, the lever comprising a pressing portion adapted to press the heat sink to the electronic device, the pressing portion defining a first contact point and a second contact point, the distance between the first contact point and the pivot point being shorter than that between the second contact point and the pivot point; and wherein when the clip is initially placed on the heat sink, the first contact point abuts a top surface of the heat sink, and when the clip is secured to the heat sink and the socket, the second contact point firmly abuts the top surface of the heat sink; and wherein the clip further comprises a rod for enhancing the fixing function of the clip.

20. The clip as recited in claim 19, wherein a pair of first and second hooks is formed at respective opposite ends of the rod, two apertures are defined in the body thereby forming a rib for engaging with the first hook of the rod, and two orifices are defined in the lever thereby forming a partition for engaging with the second hook of the rod.

* * * * *